(12) United States Patent
Aronowitz et al.

(10) Patent No.: US 6,180,470 B1
(45) Date of Patent: *Jan. 30, 2001

(54) FETS HAVING LIGHTLY DOPED DRAIN REGIONS THAT ARE SHAPED WITH COUNTER AND NONCOUNTER DORANT ELEMENTS

(75) Inventors: Sheldon Aronowitz, San Jose; Laique Khan, Milpitas; James Kimball, San Jose, all of CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/770,046

(22) Filed: Dec. 19, 1996

(51) Int. Cl.[7] .................................................. H01L 21/336
(52) U.S. Cl. .......................... 438/301; 438/302; 438/375; 438/526; 438/925
(58) Field of Search .................... 438/301, 302, 438/375, 288, 408, 526, 925

(56) References Cited

U.S. PATENT DOCUMENTS

| | | | |
|---|---|---|---|
| 4,689,667 | * | 8/1987 | Aronowitz ............................. 257/607 |
| 4,837,173 | * | 6/1989 | Alvis et al. ............................ 438/303 |
| 5,082,798 | * | 1/1992 | Arimoto ................................. 438/925 |
| 5,250,455 | * | 10/1993 | Ohzone et al. ........................ 438/288 |
| 5,292,674 | * | 3/1994 | Okabe et al. .......................... 438/302 |
| 5,308,780 | * | 5/1994 | Chou et al. ............................ 438/302 |
| 5,362,982 | * | 11/1994 | Hirase et al. .......................... 257/408 |
| 5,372,957 | * | 12/1994 | Liang et al. ............................ 438/302 |
| 5,382,533 | * | 1/1995 | Ahmad et al. ......................... 438/302 |
| 5,409,848 | * | 4/1995 | Han et al. .............................. 438/302 |
| 5,426,063 | * | 6/1995 | Kaneko et al. ........................ 438/302 |
| 5,444,003 | | 8/1995 | Wang et al. ............................. 437/31 |
| 5,478,765 | | 12/1995 | Kwong et al. ........................... 437/40 |
| 5,496,751 | | 5/1996 | Wei et al. ............................... 437/41 |
| 5,565,700 | * | 10/1996 | Chou et al. ............................ 257/408 |
| 5,585,286 | * | 12/1996 | Aronowitz et al. ................... 438/305 |
| 5,654,210 | * | 8/1997 | Aronowitz et al. ................... 438/526 |
| 5,753,556 | * | 5/1998 | Katada et al. ......................... 438/302 |

* cited by examiner

*Primary Examiner*—Carl Whitehead, Jr.
*Assistant Examiner*—James Park

(57) ABSTRACT

Lifetime of a short-channel NMOS device is increased by modifying distributions of electrically active LDD dopant at boundaries of the device's LDD regions. The LDD dopant distributions are modified by implanting counter-dopants at the boundaries of the LDD regions. Group III counter-dopants such as boron and group IV elements such as silicon alter activation properties of the LDD dopant. The dopant distributions are modified at the device's n-junctions to reduce the maximum electric field displacement at an interface defined by the device's gate and substrate. The dopant distributions can be further modified to shape the n-junctions such that hot carriers are injected away from the gate.

42 Claims, 5 Drawing Sheets

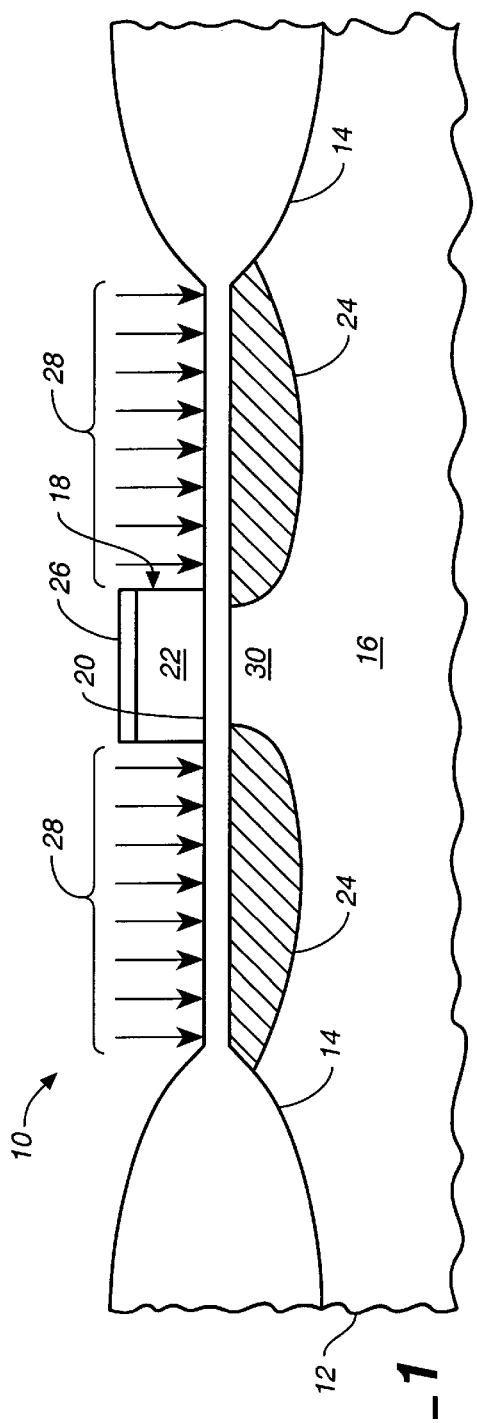
FIG._1
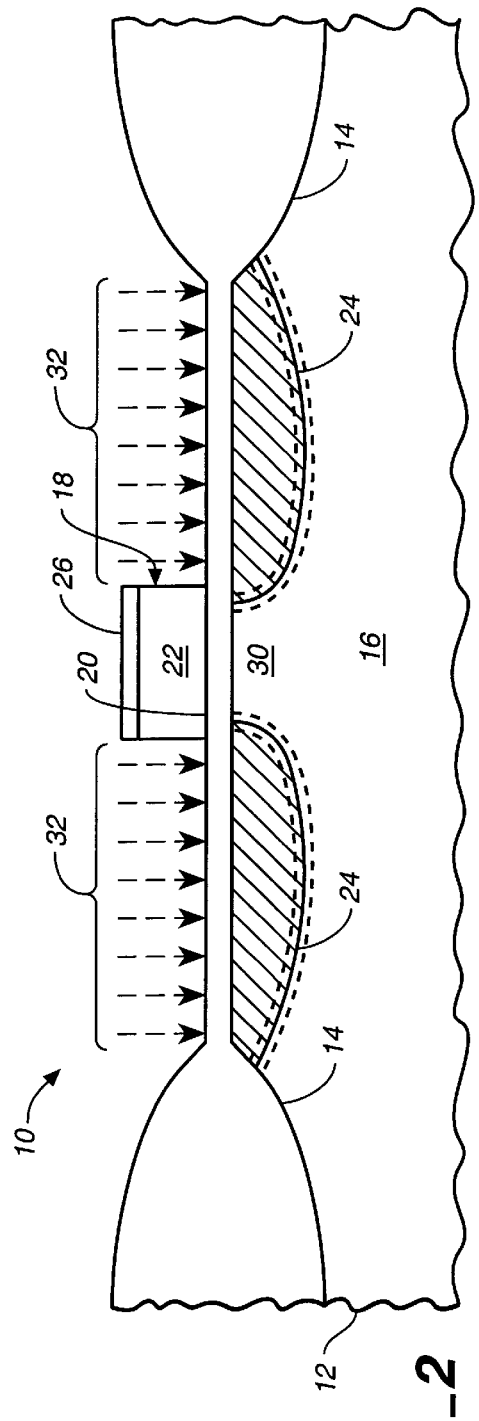
FIG._2

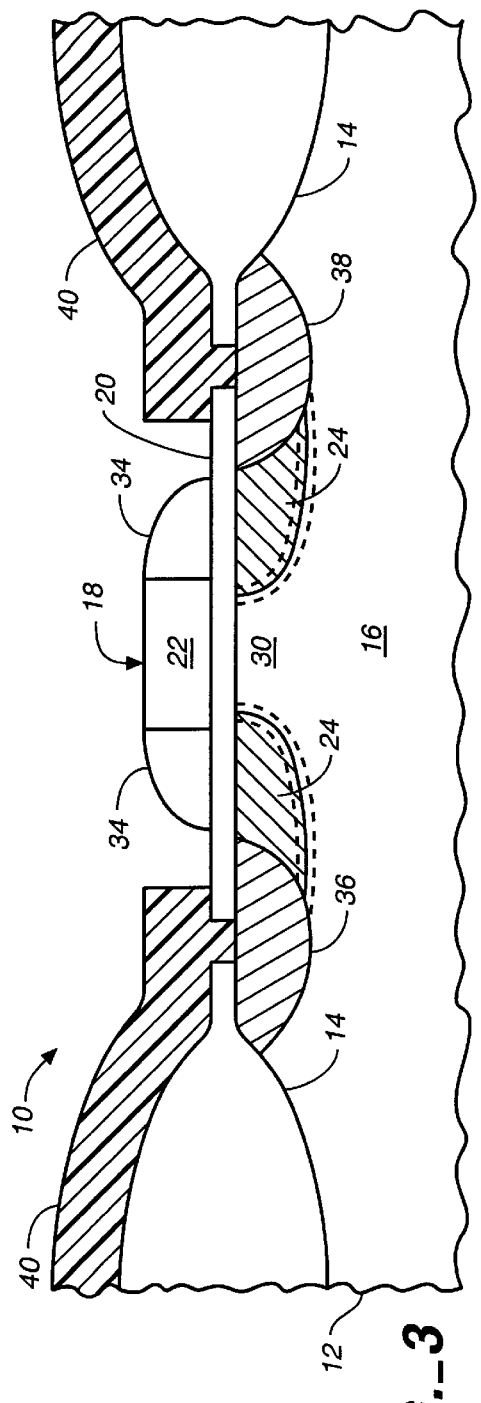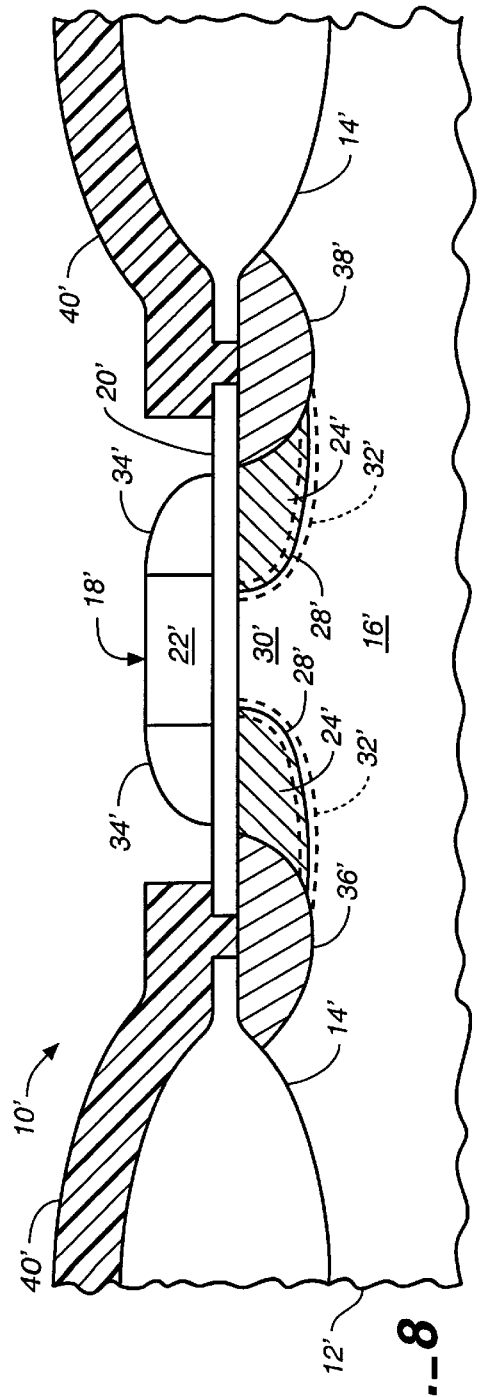

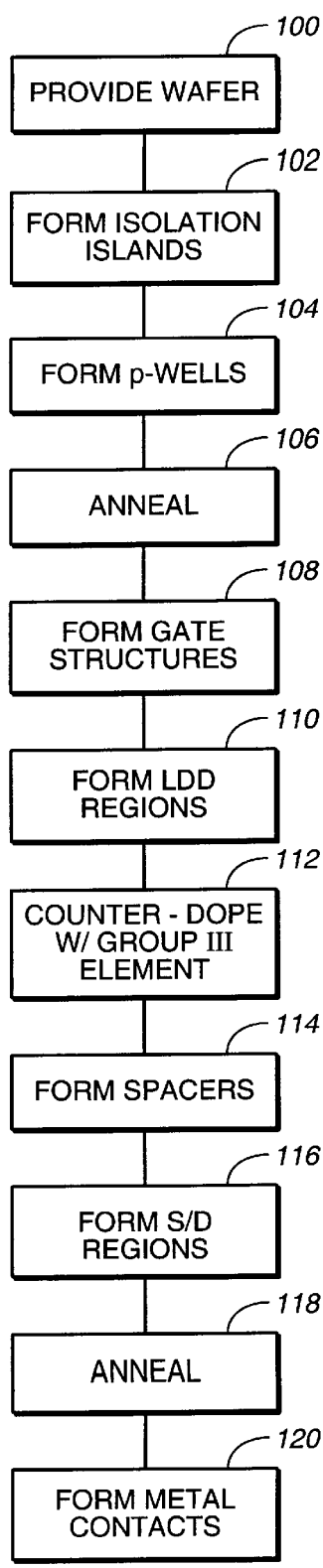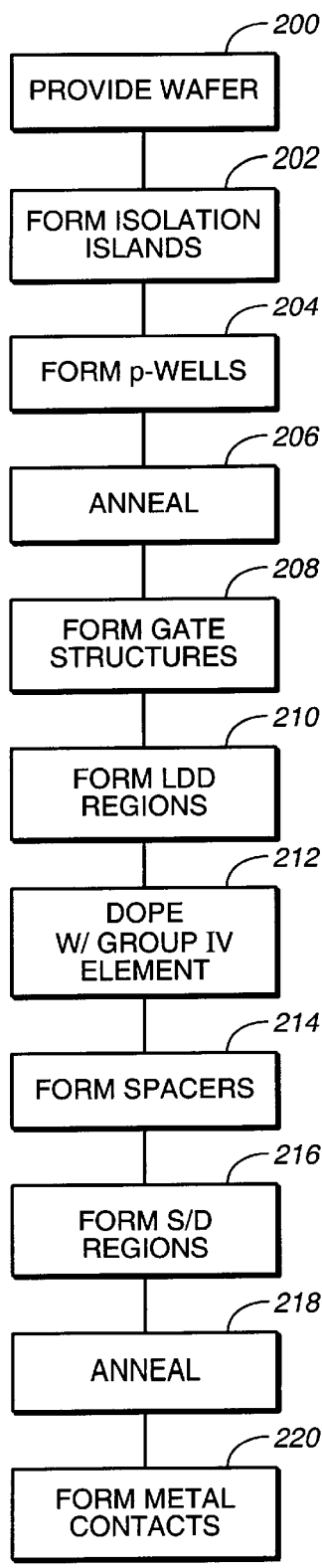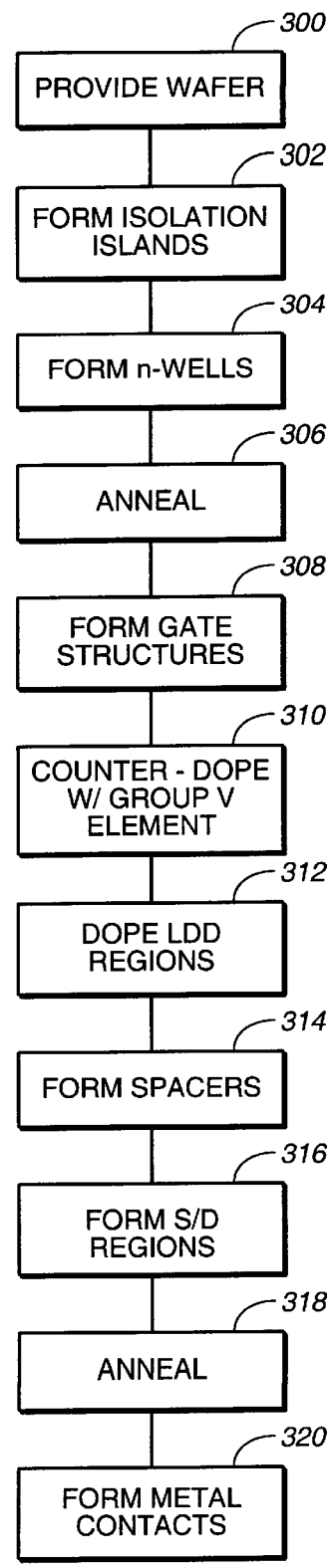
FIG._4  FIG._7  FIG._9

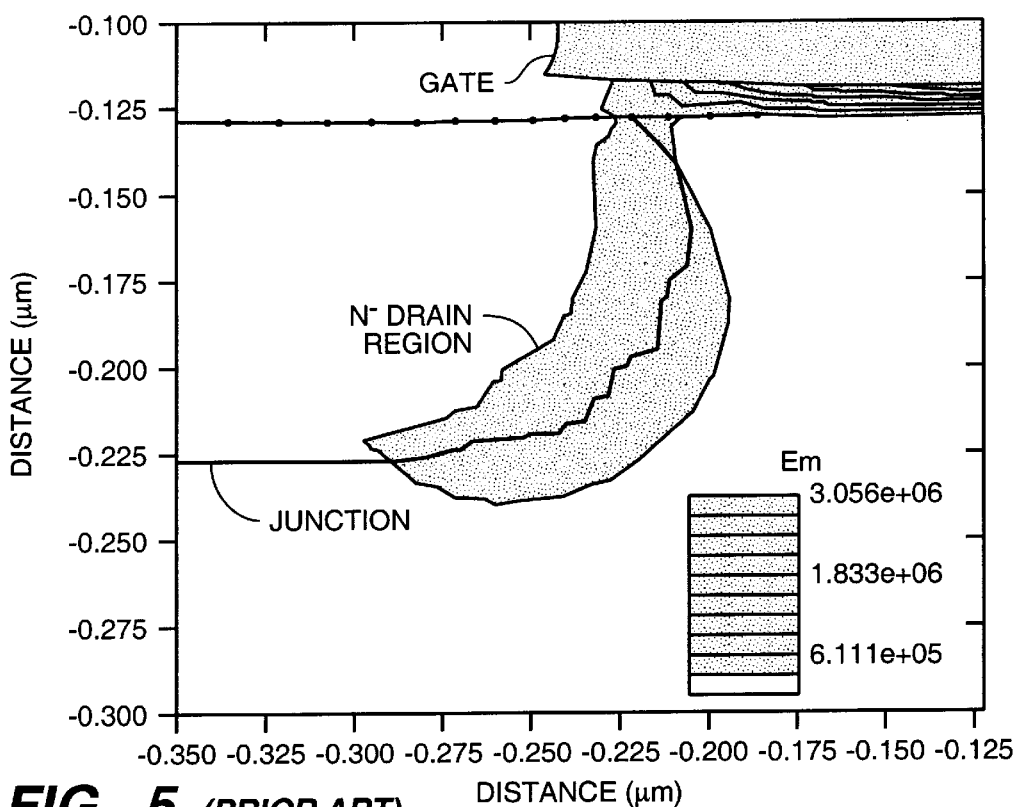
FIG._5 *(PRIOR ART)*
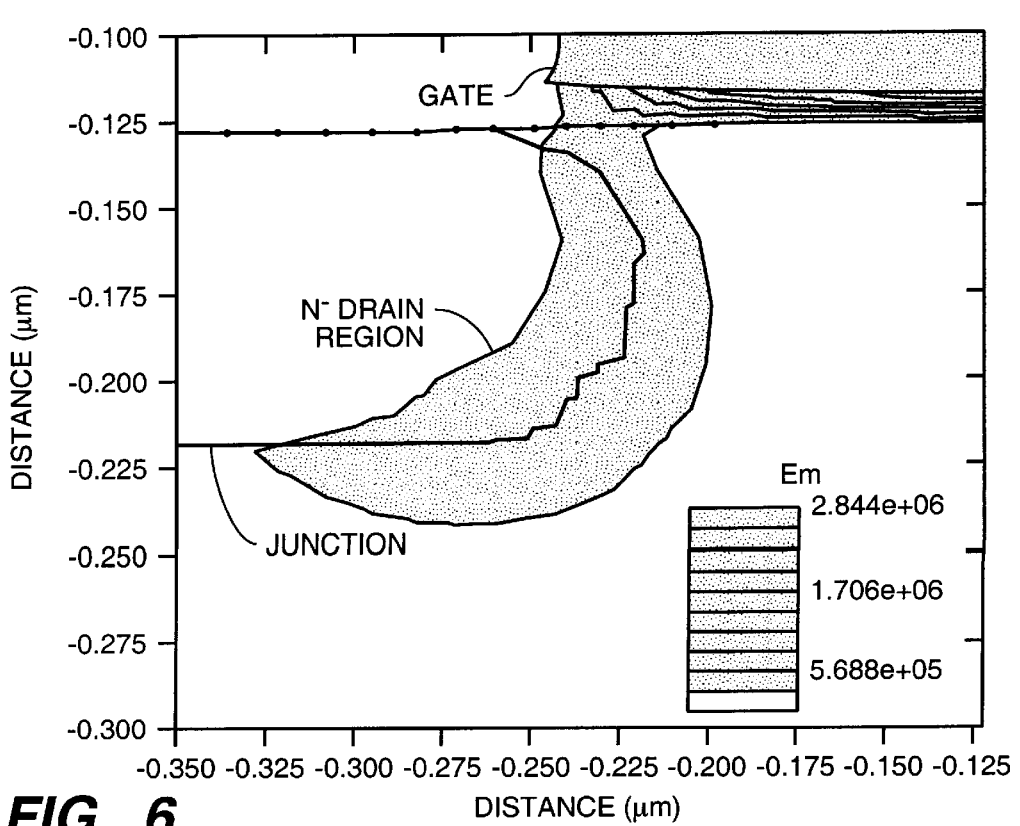
FIG._6

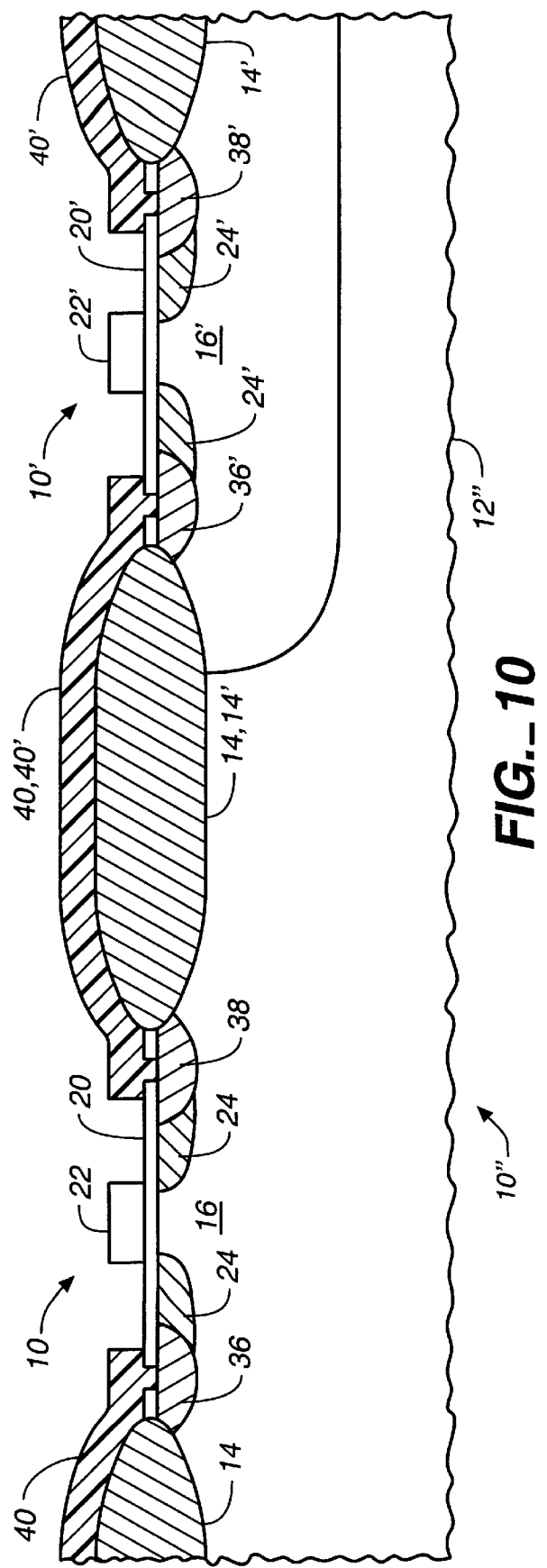
FIG._10

FETS HAVING LIGHTLY DOPED DRAIN REGIONS THAT ARE SHAPED WITH COUNTER AND NONCOUNTER DORANT ELEMENTS

BACKGROUND OF THE INVENTION

The invention relates to semiconductor devices. More specifically, the invention relates to FETS having lightly doped drains.

It is a never-ending goal of the semiconductor industry to increase the operating speeds of transistors. The speed of a Field Effect Transistor (FET) can be increased by shortening its channel length. As the channel length is shortened, the distance that carriers must travel between the FET's source and drain regions is reduced.

Device lifetime and reliability become issues of increasing concern as channel lengths of the FETs are shortened. A shorter channel length makes the FET susceptible to the effects of "hot carriers." Hot carriers are typically electrons that are accelerated by high electric fields within the channel. As the gradient of the electric field is increased, the probability of the hot carriers being injected into the thin dielectric layer of the FET's gate structure is also increased. Over time, these hot carriers create a permanent charge in the gate's dielectric. As a result, the gate operating characteristics are progressively degraded over the lifetime of the FET. Eventually, the FET is destroyed.

The effects of the hot carriers can be mitigated by forming a lightly doped drain (LDD) region contiguous with the more heavily drain region and optionally forming an LDD region contiguous with the more heavily doped source region. The LDD regions are formed below the gate oxide/substrate interface and closest to the point within the channel where the greatest electric field strength occurs. The LDD regions provide a series resistance between the drain and source regions which reduces the electrical field strength adjacent the oxide/substrate interface. This reduction in field strength directly reduces the transfer of energy to carriers at the interface. Although the speed of the carriers is slowed somewhat, the number of hot carriers injected into the gate dielectric is reduced dramatically and the lifetime of the FET gate is increased significantly.

The slope of the junction between the LDD region and the channel should be gradual in order to reduce the electric field strength and, consequently, the production of hot carriers. This requires the shape of the LDD region to be formed precisely.

However, problems exist with forming the junction. The LDD dopant, typically arsenic, does not diffuse rapidly when the FET n-channel is being annealed (even though several high temperature anneals are performed to activate the dopant). There is great difficulty in using diffusion of the LDD dopant to achieve a desired distribution. Thus, an abrupt or otherwise undesirably shaped junction results. Even with the addition of LDD regions, the imprecise formation of the junctions causes the lifetime of the FET to be reduced by the hot carriers.

SUMMARY OF THE INVENTION

The problem associated with forming the junction is overcome by methods according to the present invention. A method of forming an LDD region in a substrate of a FET comprises the steps of implanting an LDD dopant into the substrate within boundaries of the LDD region; implanting a counter-dopant into the substrate at the boundaries of the LDD region; and annealing the substrate. The counter-dopant occupies substitutional sites in the substrate's lattice structure when the substrate is annealed.

A counter-dopant such as boron in the LDD region of an n-channel MOSFET can be used to lessen the steepness of the slope of the junction, thereby reducing the high fields in the vicinity of the oxide/substrate interface. Additionally, the counter-dopant can be used to shape the junction to increase the probability that the hot carriers miss the FET's gate structure altogether.

Similarly, a Group IV species (which is electrically inactive and therefore not a counter-dopant) also can be used to shape the junction by selectively reducing the electrical activity of the LDD dopant in specific regions of the LDD. This is accomplished by using the Group IV element to reduce the number of substitutional sites available.

More generally, however, a method of forming a doped region in a semiconductor substrate comprises the steps of implanting a dopant into the substrate within boundaries of the doped region; implanting a counter-dopant or Group IV element into the substrate at the boundaries of the doped region, the counter-dopant such as boron or Group IV element will occupy substitutional sites in the substrate's lattice structure when the substrate is annealed; and annealing the substrate.

A method of fabricating an MOS device comprises the steps of forming a gate structure on a substrate; implanting an LDD dopant into the substrate on opposite sides of the gate structure; implanting a counter-dopant or Group IV element into the substrate on opposite sides of the gate structure, the counter-dopant or Group IV element being implanted at depths that define LDD regions; forming source and drain regions contiguous with the LDD regions; annealing the substrate; and forming at least one level of contacts for the source and drain regions. When the substrate is annealed, the counter-dopant occupies openings in the substrate's lattice structure more readily than the dopant.

A FET comprises a substrate; a gate structure on the substrate; LDD regions within the substrate, the LDD regions defining a channel therebetween; drain and source regions within the substrate, contiguous with the LDD regions; and at least one level of contacts on the substrate for the source and drain regions. Each LDD region includes LDD dopant atoms that occupy lattice positions in the substrate within boundaries of the LDD region. Each LDD region further includes counter-dopant atoms that occupy lattice positions at the boundaries of the LDD region.

A short-channel NMOS device comprises a substrate; a gate structure on the substrate; LDD regions within the substrate, the LDD regions defining a channel therebetween, each LDD region and an end of the channel defining a junction that is not abrupt; drain and source regions within the substrate, contiguous with the LDD regions; and at least one level of contacts on the substrate for the source and drain regions. Each LDD region includes LDD dopant atoms that occupy lattice positions in the substrate within the LDD region's boundaries. Each LDD region further includes counter-dopant atoms or Group IV atoms that occupy lattice positions at its boundaries.

BRIEF DESCRIPTION OF THE DRAWINGS

FIG. 1 is an illustration of an NMOS device according to the present invention, the NMOS device being shown during the formation of its lightly doped drain regions;

FIG. 2 is an illustration of the NMOS device while the lightly doped drain regions are being counter-doped;

FIG. 3 is an illustration of the completed NMOS device;

FIG. 4 is a flowchart of a method of fabricating the NMOS device according to the present invention;

FIG. 5 is an illustration of the field strength at the N-junction of a conventional NMOS device;

FIG. 6 illustrates the field strength at the N-junction of the NMOS device according to the present invention;

FIG. 7 is a flowchart of an alternative method of fabricating the NMOS device according to the present invention;

FIG. 8 is an illustration of a PMOS device according to the present invention;

FIG. 9 is a flowchart of a method of fabricating a PMOS device according to the present invention; and FIG. 10 is an illustration of a CMOS device according to the present invention.

DETAILED DESCRIPTION OF THE PREFERRED EMBODIMENTS

FIG. 1 shows an NMOS device 10 in the process of being fabricated. The NMOS device 10 includes a substrate 12, which can be p-type or n-type. A p-type substrate 12, for example, WOO could be lightly doped with an impurity such as boron in a concentration between $1\times10^{14}$ atoms/cm$^3$ and $5\times10^{15}$ atoms/cm$^3$, or the p-type substrate 12 could be heavily doped and have formed thereupon a thin, epitaxial layer of lightly doped p-type material. An n-type substrate could have a background doping concentration in the range of $1\times10^{14}$ atoms/cm$^3$ to $5\times10^{15}$ atoms/cm$^3$ of an n-type impurity such as phosphorus.

Isolation islands 14 are formed on the substrate 12 by conventional techniques. For example, a pad-oxide layer is deposited on the substrate 12 and a layer of nitride is deposited on the oxide layer by chemical vapor deposition. Portions of the nitride layer are etched away to expose the oxide layer at the areas where the isolation islands 14 are to be grown. The substrate 12 is heated to temperatures approaching 1000° C., as the exposed oxide is slowly grown into the isolation islands 14. The substrate 12 is heated until the isolation islands 14 reach a desired thickness, such as 5500 angstroms. After the isolation islands 14 are grown, the nitride and underlying pad-oxide are removed from the substrate 12.

A well 16 is formed in the substrate 12 by doping the substrate 12 with a p-type dopant such as boron in concentrations ranging between $5\times10^{16}$ atoms/cm$^3$ and $5\times10^{17}$ atoms/cm$^3$. After the implant, the substrate 12 is annealed to allow the implanted dopant atoms to diffuse to the desired depths. For example, the substrate 12 can be annealed at approximately 900° C. in a neutral ambient such as nitrogen for approximately 30 minutes.

A gate structure 18 formed over the well 16, between the isolation islands 14. A silicon dioxide (SiO$_2$) gate oxide 20 is grown on the substrate 12, and a layer of polysilicon is deposited on the gate oxide 20. The polysilicon layer is masked and etched into a gate 22, and an n+-type dopant such as phosphorus is implanted into the gate 22. For example, the gate oxide 20 can have a thickness ranging between 60 and 150 angstroms, and the gate 22 can have a thickness ranging between 0.25 micron and 0.35 micron.

LDD regions 24 are fabricated by masking the gate 22 with a layer of photoresist 26 and implanting an LDD dopant 28 such as low dose arsenic through the oxide layer 20 and into the substrate 12. The oxide layer 20 acts as a screening layer. The low dose arsenic can be implanted at 30–70 keV in doses ranging between $5\times10^{12}$ atoms/cm$^2$ and $1\times10^{14}$ atoms/cm$^2$. The implant angle of the low dose arsenic can be 0° or any non-0° angle. If the LDD dopant 28 is implanted at an angle, the substrate 12 must be rotated during fabrication (an implant is made on one side of the gate structure 18, the substrate is rotated by 180, and an implant is made on the opposite side of the gate structure 18). Of course, the actual dopant, dose, implant energy and implant angle are dependant upon the device specifications.

The LDD regions 24 define an n-channel 30 therebetween. The electrically-active boundaries between the LDD regions 24 and the n-channel 30 are hereinafter referred to as the drain/channel or N-junctions.

Referring now to FIG. 2, the LDD regions 24 are counter-doped with an electrically active counter-dopant 32 to define the electrically active boundaries of the LDD regions 24. The counter-dopant can be a group III element, such as boron, gallium, aluminum or indium. The presence of a counter-dopant 32 such as boron decreases the net n-type active concentration of the LDD dopant 28 at the junctions. When the substrate 12 is annealed, both the arsenic and the counter-dopant 32, boron for example, compete for crystal lattice positions in the substrate 12. On the other hand, when the Group IV species silicon is implanted to shape the region it occupies the lattice positions in the silicon substrate 12 far more easily than does arsenic. Therefore, much of the silicon will occupy the lattice positions while much of the arsenic will remain interstitial and stay electrically inactive.

When the counter-dopant 32 is implanted, its concentration in the substrate 12 has a Gaussian distribution. Therefore, the concentration has a peak concentration and a deviation. Peak concentration of the counter-dopant 32 is placed at the desired boundaries of the LDD region. Thus, an implant energy must be selected to place the peak concentration of counter-dopant 32 at the desired at the boundaries of the LDD regions 24 (or, the counter-dopant 32 could be implanted at a greater depth than the LDD dopant 28 to prevent the LDD dopant 28 from becoming electrically active beyond the LDD region boundaries). Implant energies corresponding to projected ranges and deviations of boron are readily available in "LSS" tables, which are widely published. See, for example, Gibbons, Johnson, and Mylroie, "PROJECTED RANGE STATISTICS", published by Dowden, Howard & Ross, Inc. (1975), which discusses the penetration theory of Lindhard, Scharff, and Shiott (known as the LSS theory) and provides LSS tables of implantation energies and corresponding penetration range for various atoms (e.g., silicon, boron, phosphorus, arsenic) into a silicon lattice. The energies and corresponding projection range statistics can also be calculated by commercially-available computer programs.

The implant angle affects the shape and location of the junction. An implant angle of 0° can be used to define the LDD regions 24, except that the junction between the LDD regions 24 and the channel 30 would be abrupt. A high implant angle of, say 45°, would place the N-junction beneath the gate structure 18. An implant angle of 75° would place the N-junction further beneath the gate structure 18 and would also result in an even more gradual N-junction. Implants at multiple angles would soften the slope and add curvature to the shape the N-junction. An implant angle other than 0° would require the substrate 12 to be rotated after a first implant and a second implant to be made after the substrate 12 is rotated.

Thus, implanting the counter-dopant 32 at different energies and angles allows the N-junctions to be shaped with gradual slopes rather than abrupt slopes. Additionally, the junctions can be shaped such that the very high electric fields are moved deeper into the substrate 12 and the strength of the electric field is reduced in the vicinity of the oxide/substrate interface. Moving the high fields away from the interface reduces, by scattering and recombination mechanisms, the quantity of hot carriers reaching the interface. Reducing the electric field in the vicinity of the interface reduces additional injection acceleration while favoring carrier drift to the drain (which also will lower the rate of carrier injection into the gate oxide 20).

For example, the LDD region 24 can be counter-doped with boron by implanting the Boron difluoride ion ($BF_2$) into the LDD region 24 at a dose of between $1 \times 10^{14}$ per $cm^2$ at 15 keV, 75° tilt angle and $2 \times 10^{14}$ per $cm^2$ at 25 kev, 45° tilt angle. Generally, temperature of the substrate 12 during counter-doping will be between −10° C. and 550° C. (the recrystallization temperature of silicon), but preferably, the temperature will be between −10° C. to about 30° C. For example, the $BF_2$ is implanted into a substrate 12 at room temperature (i.e., between 20° C. to about 25° C.).

Instead of being performed after doping, counter-doping or implantation of a Group IV element can be performed before the LDD dopant 28 is implanted.

Reference is made now to FIG. 3. After the LDD regions 24 have been doped and counter-doped, spacers 34 are formed over the LDD regions 24. The spacers 34, having widths between 0.1 microns and 0.25 microns, are formed by $SiO_2$ deposition.

Source and drain regions 36 and 38 are formed in the substrate 12, contiguous with the LDD regions 24. A source/drain mask is formed on the substrate 12, exposing the locations where the source and drain regions 36 and 38 are to be formed. An n-type dopant is implanted into the substrate 12 at the source and drain regions 36 and 38, and an anneal is performed to activate the n-dopant. For example, high dose arsenic is implanted in a dose between $1 \times 10^{15}$ atoms/$cm^2$ and $3 \times 10^{15}$ atoms/$cm^2$ into the source/drain regions 36 and 38, and an anneal is performed for approximately 30 minutes at about 875° C.

A doped oxide layer is deposited over the source and drain regions 36 and 38, and contact openings are opened in the oxide layer to expose the source and drain regions 36 and 38. A first level of metal contacts 40 is formed by depositing a refractory metal layer over the substrate 12 such that the contact openings are filled with the metal. A mask is laid over the metal and the metal layer is patterned. For each additional level of metalization, an intermetal dielectric is deposited on the underlying layer, a metal layer is deposited on the intermetal dielectric, and the metal layer is patterned into contacts 40.

A passivation layer (not shown) is formed over the last level of metal contacts 40. The passivation layer protects the NMOS device 10 from moisture, contaminants and scratching.

The steps for fabricating NMOS devices 10 are summarized in FIG. 4. In accordance with VLSI technology, many NMOS devices 10 are fabricated simultaneously on a wafer. Thus, a doped wafer is provided as starting material for the NMOS devices 10 (step 100). Isolation islands 14 for each NMOS device 10 are formed on the wafer (step 102), followed by formation of P-wells 16 (step 104). Then, the wafer is annealed to activate the wells 16 (step 106).

Gate structures 18 are formed on the wafer (step 108), and LDD regions 24 are formed in the substrate 12 (step 110). For each NMOS device 10, LDD regions 24 are formed on opposite sides of the gate structure 18.

The LDD regions 24 are then counter-doped with boron or another counter-dopant 28 taken from the Group III elements (step 112). Peak concentration of the boron is placed at the boundaries of the LDD regions 24.

Spacers 34 are formed over the LDD regions 24 (step 114), and then the source and drain regions 36 and 38 are formed (step 116). The substrate is annealed (step 118), causing the LDD regions 24 and source and drain regions 36 and 38 to be activated. During annealing, boron and arsenic diffuse, with the boron atoms beating the arsenic atoms to the lattice positions in the substrate 12. As a result, the boron becomes electrically active beyond the boundaries of the LDD regions 24 while the arsenic remains electrically inactive.

After annealing, at least one level of metal contacts 40 is formed over the source and drain regions 36 and 38 (step 120).

FIGS. 5 and 6 provide a comparison of the electric field strengths in the vicinity of the channel of a conventional 0.5 micron NMOS device and a 0.5 micron NMOS device according to the present invention. FIG. 5 shows the conventional NMOS device having its distribution of the largest electric field occurring in the channel. The highest field is contained within the gate, away from the gate edge by at least 25 nm. The conventional NMOS device has a maximum field strength in the $N^-$ region/channel of the drain of $6.11 \times 10^5$ V/cm.

FIG. 6 shows that the NMOS device 10 according to the present invention has a maximum field strength in the vicinity of the channel 30 of $5.688 \times 10^5$ V/cm due to the location of probable carrier injection being shifted to the fringe of the gate structure 18. Such a reduction of the maximum field in the vicinity of the channel 30 reduces the impact ionization rate by approximately an order of magnitude. Consequently, fewer hot carriers are injected into the gate oxide 20. The shift of the high electric field to the edge of the gate structure 18 also reduces the impact on the threshold voltage of the carriers that are injected since the injection then occurs primarily over the N-doped region and not over the channel.

Reference is now made to FIG. 7, which shows an alternative method of fabricating the NMOS device 10. Steps 200–210 are the same as the steps 100–110, up to and including the formation of the LDD regions 24.

In step 212, however, the LDD regions 24 are counter-doped with a sub-amorphizing dose of a group IV element, such as silicon. Sub-amorphizing doses of less than $5 \times 10^{14}$ atoms/$cm^2$ for silicon is not sufficient to result in amorphization (destruction) of the single crystal lattice of the semiconductor substrate 12. Additionally, sub-amorphization of the LDD region 24 does not cause a measurable change in the leakage current across the drain/channel junction. The amount of leakage current across the drain/channel junction is the same as the amount across the drain/channel in a crystalline region that is not counter-doped.

It is preferred to counter-dope the LDD regions 24 with the same group IV element as the substrate 12. That is, it is preferred to implant a silicon counter-dopant into a silicon substrate, a germanium counter-dopant into a germanium substrate, etc. However, a silicon counter-dopant could be implanted into a germanium substrate, a germanium counter-dopant could be implanted into a silicon substrate, and so on.

Concentration of the implanted group IV element also has a Gaussian distribution. Thus, an implant energy must be selected to place the peak concentration of the group IV element at the desired boundaries of the LDD regions 24. Projected range and deviation statistics for the sub-amorphizing silicon, as well as steps for implanting the sub-amorphizing silicon, are disclosed in U.S. Ser. No. 08/306,179 filed on Sep. 13, 1994 by Aronowitz and Kimball (Atty Docket No. LLC-2339), which is incorporated herein by reference. The implant energies for silicon can also be obtained from published "LSS" tables, given the implanting atom, the lattice to be implanted, and the desired depth of the implant. Reference is once again made to Gibbons, Johnson, and Mylroie, in "PROJECTED RANGE STATISTICS", which discusses the LSS theory and provides LSS tables of implant energies and corresponding range statistics for implanting silicon into a silicon lattice.

After the implant energy has been selected, a sub-amorphizing dose of the group IV element is determined. The dose for sub-amorphizing silicon will be between $1 \times 10^{12}$ atoms/cm$^2$ to $5 \times 10^{14}$ atoms/cm$^2$. Doses in excess of $5 \times 10^{14}$ atoms/cm$^2$ begin amorphization of the single crystal lattice. However, the actual maximum dosage can be determined empirically. Amorphization can be readily ascertained in a single crystal structure by examination of the structure, after implantation, but before annealing, by Rutherford Back Scattering (RBS)analysis, which will show 100% disruption of the crystal lattice. Such examination allows for the true maximum dose to be determined.

Shape of the junction is determined partly by the implant angle of the group IV element. As with the group III element, implanting the group IV element at different energies and angles allows the junction to be shaped with a gradual slope rather than an abrupt slope. Additionally, the junction can be shaped such that the very high electric fields are moved deeper into the substrate 12 and that the strength of the electric field is reduced in the vicinity of the oxide/substrate interface.

Generally, the group IV element is implanted into a substrate 12 having a temperature between –10° C. and 550° C. (the recrystallization temperature of silicon), but preferably, between –10° C. to about 30° C. For example, the sub-amorphizing silicon is implanted into a substrate 12 at room temperature (i.e., between 20° C. to about 25° C.).

After the LDD regions 24 have been counter-doped, spacers 34 are formed over the LDD regions 24 (step 214). Then, source and drain regions 36 and 38 are formed (step 216).

An anneal is performed (step 218), with the silicon competing with, and being incorporated into the lattice more readily, the LDD dopant 28 to the lattice positions in the substrate 12. Thus, the silicon prevents much of the LDD dopant 28 beyond the boundaries of the LDD regions 24 from becoming electrically active. The silicon that is interstitial will not affect the flow of current between the source and drain regions 36 and 38.

At least one level of metal contacts 40 is formed over the source and drain regions 36 and 38 (step 220). A passivation layer can also be formed over the last level of metal contacts 40.

Reference is now made to FIGS. 8 and 9. Although the methods above have been described in connection with an NMOS device 10, the above-methods can be applied to the fabrication of a PMOS device 10' as well. Concentrations and doses for the PMOS device 10' are roughly the same as above for the NMOS device 10. Only the dopants and counter-dopant are different. A lightly n-doped wafer (substrate 12') is provided as starting material for the PMOS devices 10' (step 300). Isolation islands 14' for each PMOS device 10' are formed on the wafer (step 302), followed by formation of n-wells 16' (step 304). The wafer is annealed to activate the n-wells 16' (step 306). Gate structures 18' are formed on the wafer over the n-wells 16' (step 308). LDD regions 24' are counter-doped with a counter-dopant 32': a group IV element such as silicon or a group V element such as phosphorus (step 310). Peak concentration of the counter-dopant 32' is placed at the boundaries of the LDD regions 24'. The counter-dopant 32' for the PMOS device 10' affords less control in shaping the LDD regions than does the counter-dopant 32 for the NMOS device 10. This is because an LDD dopant 28' such as boron (for the PMOS device) diffuses much faster than an LDD dopant 28 such as arsenic (for the NMOS device).

However, shaping the junction to avoid the effects of hot carriers is not as important for the PMOS device 10' as it is for the NMOS device 10. Hot electron effects in the NMOS device 10 are more severe than hot hole effects in the PMOS device 10' because of higher electron mobility and production rates (avalanching phenomena).

After counter-doping, the LDD 24' regions are doped, typically with boron (step 312). For each PMOS device 10', LDD regions 24' are formed on opposite sides of the gate structure 18'.

Spacers 34' are formed over the LDD regions 24' (step 314), and then the source and drain regions 36' and 38' are formed (step 316). The substrate is annealed (step 318), whereby the LDD regions 24' and the source and drain regions 36' and 38' are activated.

After annealing, at least one level of metal contacts 40' is formed over the source and drain regions 36' and 38' (step 320). A passivation layer can be formed over the last level of metal contacts 40'.

Referring now to FIG. 10, the methods above could also be applied to the formation of CMOS devices 10", which include complementary pairs of NMOS devices 10 and PMOS devices 10'. The NMOS and PMOS devices 10 and 10' are formed on the same substrate 12", with the NMOS devices 10 being formed in heavily-doped p-type regions 16 and the PMOS devices 10 being formed in heavily-doped n-type regions 16'. During fabrication of the CMOS devices 10", separate masking and implantation steps are performed during the formation (including the counter-doping) of the NMOS LDD regions 24 and the PMOS LDD regions 24'.

Thus disclosed are methods of modifying and controlling activation of electrically active species in semiconductor substrates. By implanting a counter-dopant into a doped region of a semiconductor substrate, electrically-active boundaries of the doped region can be formed with greater precision. Moreover, the electrically-active boundaries are less susceptible to shifting with subsequent heating steps, since the lattice spaces around the boundaries cannot be occupied by the dopant, having already been occupied by the counter-dopant.

The methods can be applied to the fabrication of LDD regions in FETs. By selecting implant energies and angles of the counter-dopant, the slope of the junction between the LDD region and the channel can be softened to lower the electric fields at the gate/substrate interface. Lowering the electric fields by 10% can decrease impact ionization by an order of a magnitude. Additionally, the junction can be shaped to decrease impact ionization near the FET's gate structure. Consequently, lifetime and reliability of FETs are increased.

The methods are especially useful for the fabrication of short-channel NMOS devices, long-channel NMOS devices operable at high voltages and any other NMOS devices in which little room is available to move the N-junction. However, the invention is generally applicable to all MOS devices, short and long channel, even those having deeper and more gently contoured LDD regions.

It is understood that various changes and modifications may be made without departing from the spirit and scope of the invention. The methods and device are not limited to the materials, dopants, doses, implant energies and implant angles described above. Rather, the materials, dopants, doses, implant energies and implant angles are device-dependent, varying upon the desired operational specifications of the MOS device. Moreover, the method is not limited to the fabrication steps (e.g., depositing, masking, patterning) described above or to the exact order in which they are described. A wide variety of semiconductor fabrication techniques are available. Accordingly, the present invention is not limited to the precise embodiments described hereinabove. Instead, it is defined by the claims that follow.

We claim:

1. A method of forming an LDD region in a substrate of a FET, the substrate having a crystal lattice structure, the method comprising the steps of:

implanting an LDD dopant into the substrate at the boundaries of the LDD region;

implanting a counter-dopant into the substrate in a manner that a peak concentration of the counter-dopant is at the boundaries of the LDD region that lie within the substrate, the counter-dopant occupying openings in the lattice structure more readily than the LDD dopant when the substrate is annealed; and annealing the substrate.

2. The method of claim 1, wherein the FET is an NMOS device, and wherein the counter-dopant is a group III element.

3. The method of claim 1, wherein the FET is a PMOS device, and wherein the counter-dopant is a group V element.

4. The method of claim 1, wherein the FET is a CMOS device including PMOS and NMOS transistors, and wherein the counter-dopant is a group V element for the PMOS transistors and a group III element for the NMOS transistors.

5. The method of claim 1, wherein the FET is a CMOS device including PMOS and NMOS transistors, and wherein the counter-dopant is a group IV element for the PMOS transistors and the NMOS transistors.

6. The method of claim 1, wherein the LDD dopant is implanted before the counter-dopant.

7. The method of claim 1, wherein the LDD dopant is implanted after the counter-dopant.

8. The method of claim 1, wherein the FET includes a channel, one end of the channel and the LDD region defining a junction, and wherein the counter-dopant is implanted such that the junction is not abrupt.

9. The method of claim 8, wherein an angle implant of at least 45 degrees is used to implant the counter-dopant at the junction.

10. The method of claim 9, wherein the FET includes a gate, the gate and the substrate defining a gate/substrate interface, and wherein the junction is shaped such that hot carriers are injected away from the gate/substrate interface.

11. The method of claim 10, wherein the counter-dopant is implanted at the junction at different implant angles and energies.

12. The method of claim 1, wherein the counter-dopant is also implanted beyond the boundaries of the LDD region.

13. A method of forming a doped region in a semiconductor substrate having a crystalline lattice structure, the method comprising the steps of:

implanting a dopant into the substrate within boundaries of the doped region;

implanting a counter-dopant into the substrate in a manner that a peak concentration of the counter-dopant is at the boundaries of the doped region that lie within the substrate, the counter-dopant occupying openings in the lattice structure more readily than the dopant when the substrate is annealed; and annealing the substrate.

14. The method of claim 13, wherein the dopant is a group V element, and wherein the counter-dopant is a group III element.

15. The method of claim 13, wherein the dopant is a group III element, and wherein the counter-dopant is a group V element.

16. The method of claim 13, wherein the dopant is implanted before the counter-dopant.

17. The method of claim 13, wherein the dopant is implanted after the counter-dopant.

18. A method of fabricating an MOS device, the method comprising the steps of:

forming a gate structure on a substrate;

implanting an LDD dopant into the substrate on opposite sides of the gate structure;

implanting a counter-dopant into the substrate on opposite sides of the gate structure, regions, wherein a peak concentration of the counter-dopant is at depths that define the respective boundaries of the LDD regions that lie within the substrate, the counter-dopant occupying openings in the substrate's lattice structure more readily than the LDD dopant when the substrate is annealed;

forming source and drain regions contiguous with the LDD regions; and annealing the substrate, forming at least one level of contacts for the source and drain regions.

19. The method of claim 18, wherein the LDD dopant is implanted before the counter-dopant.

20. The method of claim 18, wherein the LDD dopant is implanted after the counter-dopant.

21. The method of claim 18, wherein the LDD regions define a channel therebetween, a junction being defined by an end of the channel and an LDD region, and wherein the counter-dopant is implanted such that the junctions are not abrupt.

22. The method of claim 21, wherein an angle implant of at least 45 degrees is used to implant the counter-dopant at the junction.

23. The method of claim 21, wherein the junctions are shaped such that hot carriers are injected away from an interface defined by the gate structure and the substrate.

24. The method of claim 23, wherein the counter-dopant is implanted at the junctions at different implant angles and energies.

25. A method of forming an LDD region in a substrate of a FET, the substrate having a crystal lattice structure, the method comprising the steps of:

implanting an LDD dopant into the substrate within boundaries of the LDD region;

implanting a Group IV element into the substrate in a manner that a peak concentration of the counter-dopant is at the boundaries of the LDD region that lie within the substrate, the Group IV element occupying openings in the lattice structure more readily than the LDD dopant when the substrate is annealed; and annealing the substrate.

26. The method of claim 25, wherein the LDD dopant is implanted before the Group IV element.

27. The method of claim 25, wherein the LDD dopant is implanted after the Group IV element.

28. The method of claim 25, wherein the FET includes a channel, one end of the channel and the LDD region defining a junction, and wherein the Group IV element is implanted such that the junction is not abrupt.

29. The method of claim 28, wherein an angle implant of at least 45 degrees is used to implant the counter-dopant at the junction.

30. The method of claim 29, wherein the FET includes a gate, the gate and the substrate defining a gate/substrate interface, and wherein the junction is shaped such that hot carriers are injected away from the gate/substrate interface.

31. The method of claim 30, wherein the Group IV element is implanted at the junction at different implant angles and energies.

32. The method of claim 25, wherein the Group IV element is also implanted beyond the boundaries of the LDD region.

33. A method of forming a doped region in a semiconductor substrate having a crystalline lattice structure, the method comprising the steps of:

implanting a dopant into the substrate within boundaries of the doped region; implanting a Group IV element into the substrate in a manner that a peak concentration of the counter-dopant is at the boundaries of the doped region that lie within the substrate, the Group IV element occupying openings in the lattice structure more readily than the dopant when the substrate is annealed; and annealing the substrate.

34. The method of claim 33, wherein the dopant is implanted before the Group IV element.

35. The method of claim 33, wherein the dopant is implanted after the Group IV element.

36. A method of fabricating an MOS device, the method comprising the steps of:

forming a gate structure on a substrate;

implanting an LDD dopant into the substrate on opposite sides of the gate structure;

implanting a Group IV element into the substrate on opposite sides of the gate structure, wherein a peak concentration of the Group IV element is at depths that define the respective boundaries of the LDD regions that lie within the substrate, the Group IV element occupying openings in the substrate's lattice structure, more readily than the LDD dopant when the substrate is annealed;

forming source and drain regions contiguous with the LDD regions; and annealing the substrate, forming at least one level of contacts for the source and drain regions.

37. The method of claim 36, wherein the LDD dopant is implanted before the Group IV element.

38. The method of claim 37, wherein the LDD dopant is implanted after the Group IV element.

39. The method of claim 37, wherein the LDD regions define a channel therebetween, a junction being defined by an end of the channel and an LDD region, and wherein the Group IV element is implanted such that the junctions are not abrupt.

40. The method of claim 39, wherein an angle implant of at least 45 degrees is used to implant the counter-dopant at the junction.

41. The method of claim 39, wherein the junctions are shaped such that hot carriers are injected away from an interface defined by the gate structure and the substrate.

42. The method of claim 41, wherein the Group IV element is implanted at the junctions at different implant angles and energies.

* * * * *